(12) United States Patent
Osako et al.

(10) Patent No.: US 6,600,146 B2
(45) Date of Patent: Jul. 29, 2003

(54) PHOTOELECTRIC SWITCHES

(75) Inventors: Kazunori Osako, Kyoto (JP); Kiyoshi Imai, Kyoto (JP); Tetsuya Akagi, Kyoto (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 10/046,069

(22) Filed: Jan. 11, 2002

(65) Prior Publication Data

US 2002/0096627 A1 Jul. 25, 2002

(30) Foreign Application Priority Data

Jan. 11, 2001 (JP) ........................................ 2001-003515

(51) Int. Cl.[7] .............................................. H01J 40/14
(52) U.S. Cl. .............................. 250/214 LS; 250/214 R
(58) Field of Search ..................... 250/214 LS, 214 SW, 250/214 D, 214 AL, 214 R; 356/221, 222, 223, 226, 229; 327/514

(56) References Cited

U.S. PATENT DOCUMENTS

| 3,862,414 | A | * | 1/1975 | Algeri ..................... 250/214 R |
| 4,381,446 | A | * | 4/1983 | Fukuyama et al. ....... 250/214 R |
| 4,388,527 | A | * | 6/1983 | Fukuyama et al. ....... 250/214 R |
| 5,126,555 | A | * | 6/1992 | Hawryluk ............... 250/214 SW |
| 5,430,290 | A | * | 7/1995 | Merle et al. ............. 250/208.1 |
| 5,585,623 | A | * | 12/1996 | Ohtomo et al. .......... 250/214 R |
| 5,990,628 | A | * | 11/1999 | Birrell .................... 250/214 R |

FOREIGN PATENT DOCUMENTS

EP 633457 A1 * 1/1995 .......... 250/214 SW

* cited by examiner

Primary Examiner—Diego Gutierrez
Assistant Examiner—Stanley J. Pruchnic, Jr.
(74) Attorney, Agent, or Firm—Beyer Weaver & Thomas LLP

(57) ABSTRACT

A photoelectric switch emits pulsed detection light and outputs a light detection signal as reflected light is received. For generating an on-off judgment output for switching on and off, the level of the light detection signal is shifted towards a specified level during a specified light receiving period by an amount corresponding to the difference between the specified and the level of the light detection signal at a time immediately before the pulsed detection light is expected to arrive. On the basis of thus level-shifted signal, it is determined whether at least one of the conditions for generating the on-off judgment output is satisfied. The on-off judgment output is generated at least on the condition that the levels of the light detection signal at specified timings are in a specified size relationship. According to another embodiment, pulsed detection light is emitted at least three times per cycle of noise from a fluorescent lamp and comparisons are made between a specified level and the level of the light detection signal whenever a peak of the pulsed detection light is expected to arrive, and the on-off judgment output is generated according to the majority of the results of comparisons made during a period of light emission.

18 Claims, 12 Drawing Sheets

PHOTOELECTRIC SWITCHES

BACKGROUND OF THE INVENTION

This invention relates to a photoelectric switch with a corrective measure against noise, for example, from a fluorescent lamp of the inverter type. More in particular, this invention relates to such a photoelectric switch adapted to eliminate the effects of noise from a fluorescent lamp as much as possible, prior to an on-off judgment process for determining whether to switch on or off the switch, by adjusting received light detecting signals to a specified level as of a moment immediately before pulsed detection light is expected to arrive after being reflected by a target object.

As is well known, a photoelectric switch of this type is comprised of a light emitting means, a light receiving means and a signal processing means. In the case of a switch of the reflection type, the light emitting means and the light receiving means are generally disposed within a same housing. In the case of a switch of the transmission type, the light emitting means and the light receiving means are generally disposed in mutually separated housings.

The light emitting means includes a driving means for outputting a driving pulse signal (hereinafter referred to as the "driving pulse") at the timing specified by a light emission control signal and a light emitting element for emitting pulsed detection light to a target region in response to the driving pulse outputted from the driving means. The light receiving means includes a light receiving element for receiving the pulsed detection light arriving from the target area and an amplifier for generating the output from the light receiving element to generate a light detection signal. The signal processing means serves to output the result of the on-off judgment process. The on-off judgment process (or "on-off judgment") is the process whereby it is determined whether to switch on or off the switch, depending on whether or not a target object is found to be present in the target region.

FIG. 12 shows an example of waveform diagram of the driving pulse PD and light detection signal VS2. The driving pulse PD is a rectangular wave with peaks appearing at regular timing intervals T. The light detection signal VS2 has a typical hill-shaped waveform, rising suddenly to reach a peak pk during a period between points of time corresponding to the front and back edges of the driving pulse PD, dropping quickly and overshooting to reach a bottom bm and thereafter gradually returning to the zero-level. The causes of the overshooting portion include the capacitance of the amplifier of the light receiving means.

If the base level of the hill-shaped waveform of the light receiving signal VS2 were always as stable as shown in FIG. 12, a reliable on-off judgment would be possible by sampling the light receiving signal VS2 at a timing with a slight delay from that of the driving pulse PD and comparing the level of the sampled light receiving signal VS2 with a specified threshold value.

FIG. 13 shows an example of driving pulse PD, the range ΔT of variations in the timing for the generation of sampling pulse PS and the noise component VN2 due to an inverter fluorescent lamp.

Photoelectric switches of this type have typically a light emission period T which is relatively close to the on-off period of inverter type fluorescent lamps commonly used for illumination at factories in Europe. If a photoelectric switch of this type is installed in an environment where such fluorescent lamps are employed, the light receiving signal VS2 as shown in FIG. 12 and the noise component VN2 of the fluorescent lamps will be superposed. As a result, the base level of the hill-shaped waveform of the light receiving signal VS2 varies from one period to another, and a reliable on-off judgment will not be possible by a simple method of comparing a threshold value with the level of the light receiving signal VS2 at a timing with a delay of a specified time length from that of the driving pulse PD.

Even in the absence of noise component VN2 in the fluorescent lamps, it is difficult to completely suppress the variations in the timing for the generation of sampling pulse PS by means of the capacitance of circuit elements because it cannot be avoided to determine the timing for the generation of sampling pulse PS on the basis of the timing for the generation of the driving pulse PD. In the case of a switch of the transmission type, in particular, the driving pulse PD is transmitted from the light receiving device to the light emitting device through a communicating means and the range of variation ΔT is not negligible because of the variations in the transmission time for this communication.

In view of the above, the present inventors proposed a procedure whereby the level of the light receiving signal is shifted towards the specified level by an amount corresponding to the difference between the level of the light receiving signal at the moment immediately before the pulsed detection signal is expected to arrive and the specified level during the period in which the detection signal waveform of the pulsed detection light is expected to be obtained and it is determined whether at least one of the conditions to be used for an on-off judgment is satisfied on the basis of the level of the light receiving signal after it has thus been shifted.

By such a signal processing method, it was expected that the effects of noise components from a fluorescent lamp would be eliminated and a reliable on-off judgment would be possible because use is made of an algorithm whereby a comparison with the threshold level is made only after noise components are removed from the level of the light detection signal. After a diligent investigation by the present inventors, however, it has been discovered that problems still remain with the reliability of the on-off judgment results even with such a signal processing method with a routine for removing noise components as described above.

One of the reasons for this is that it is difficult to accurately estimate the timing immediately before the pulsed detection signal is expected to arrive. In the case of a photoelectric switch of the transmission type, in particular, since the driving pulse PD is transmitted from the light emitting device to the light receiving device through a communicating means, it is not possible to accurately estimate the expected arrival time of the pulsed detection signal because of the variations in the time of transmission by this communication means. If there is a large variation in the arrival time of the pulsed detection signal, an accurate on-off judgment is not possible no matter how adequate the threshold value used for the judgment is.

Another reason is that, even if the timing for the arrival of the pulsed detection signal could be accurately determined, an accurate on-off judgment would still be impossible. It is because, if the timing thus determined happens to coincide with a portion of the waveform of the noise component VN2 from the fluorescent lamp where the waveform is changing rapidly (such as at phase 0°, 180° and 360°) and if the light detection level of the pulsed detection light happens to be near (either above or below) the threshold value for the judgment, the light detection signal level may erroneously exceed or fail to exceed the threshold value due to the effects of noise component VN2.

The present invention is for solving such problems of photoelectric switches with such a level shifting function.

SUMMARY OF THE INVENTION

It is an object of this invention to provide a photoelectric switch with a level shifting function having a more reliable on-off judgment capability.

It is another object of this invention to provide such a photoelectric switch which is reliable even when the timing for the sampling of detection signal necessary for the on-off judgment is somewhat displaced.

It is a further object of this invention to provide such a photoelectric switch which is reliable even when the sampling timing for detection signal happens to coincide with a rapidly changing portion of the waveform of the detection signal caused by a noise component.

A photoelectric switch embodying this invention, with which the above and other objects can be accomplished, comprises a light emitting means for periodically emitting pulsed detection light, a light receiving means for photoelectrically converting the pulsed detection light and thereby outputting corresponding light detection signals, and a signal processing means for generating an on-off judgment output for switching on or off this photoelectric switch. The signal processing means includes a level shifting means for shifting the level of the light detection signals towards a specified level at least during a specified light receiving period by an amount corresponding to the difference between the specified level and the level of the light detection signal at a time immediately before the pulsed detection light is expected to arrive, and a condition judging means for judging, on the basis of the light detection signal with the level shifted by the level shifting means, whether or not at least one of conditions to be used for generating the on-off judgment output is satisfied.

According to an embodiment of the invention, the condition judging means serves to generate the on-off judgment output at least on the condition that the levels of the light detection signal at a first timing when a peak of the light detection signal is expected to arrive and at a second timing when a bottom of the light detection signal after an overshoot period is expected to arrive are in a specified size relationship. A reliable on-off judgment is possible according to this embodiment because even if the first and second timings are somewhat displaced from the peak or bottom of the waveform of the detection signal, the size relationship being examined is hardly affected. Thus, the expressions "first timing" and "second timing" used herein should be interpreted broadly. They are not required to coincide accurately with the peak or bottom of the waveform of the detection signal.

According to a more preferred embodiment, the condition judging means serves to generate the on-off judging output additionally on the condition that the level of the light detection signal at the first timing and the specified level is in a specified size relationship.

According to a second embodiment of the invention, the light emitting means is controlled to emit light at least three times per period of light emission from an inverter fluorescent lamp in the environment of the photoelectric switch. The condition judging means compares a specified level and the level of the light detection signal at times when a peak of the pulsed detection light is expected to arrive, generating the on-off judgment output according to the majority of the comparison results obtained within a period of light emission from the fluorescent lamp.

DETAILED DESCRIPTION OF THE INVENTION

Figure 1:
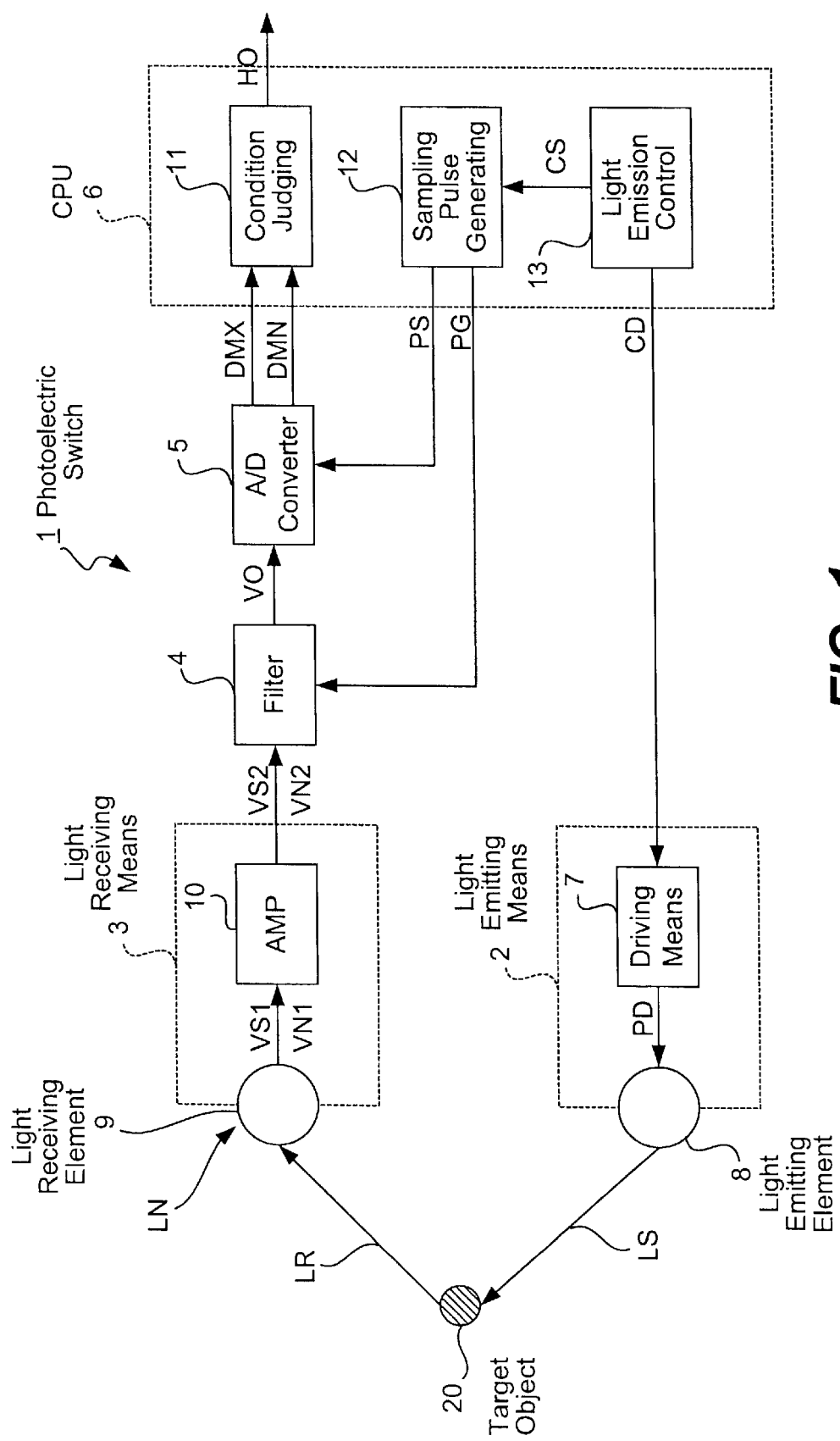
FIG. 1 is a basic structural diagram of a photoelectric switch of the reflection type according to a first embodiment of the invention.

As explained above, a photoelectric switch embodying this invention comprises a light emitting means for periodically emitting pulsed detection light, a light receiving means for photoelectrically converting received pulsed detection light to output a corresponding light detection signal and a signal processing means for generating an on-off judgment output on the basis of the light detection signal from the light receiving means.

The signal processing means include a level shifting means and a condition judging means. The level shifting means is for shifting towards a specified level the level of the light detecting signal during a specified light receiving period by an amount corresponding to the difference between the level of the light detection signal at a moment immediately before the pulsed detection light is expected to arrive and the specified level. The condition judging means is for judging on the basis of the light detection signal after its level has been shifted by the level shifting means whether or not at least one of the necessary conditions for an on-off judgment is satisfied. In the above, the "specified light receiving period" is the period during which a light detection signal corresponding to the pulsed detection light reflected by a target object is expected to be received.

The function of the aforementioned level shifting means may be carried out by software by using a microprocessor or by hardware by means of a dedicated analog circuit, as will be described below.

Any number of software methods may be considered by persons skilled in the art. One of them would be to continuously carry out A/D conversions of the levels of light detection signals outputted from the light receiving means at a specified sampling frequency period, to store them sequentially in a memory and to thereafter subtract or add the value of the data immediately before the expected moment of arrival of the pulsed detection light from or to one or more of the data values at as many timings to be used for the on-off judgment.

A photoelectric switch of this invention is not only of such a structure but also has one or both of the following two selectable characteristics.

One of these two characteristics relates to the aforementioned condition judging means. A photoelectric switch having a condition judging means with this characteristic makes a comparison between the level of the detection signal at a first timing when a peak of the waveform of the light detection signal of the pulsed detection light is expected to arrive and the level of the light detection signal at a second timing when its bottom after an overshoot period is expected to arrive and carries out the one-off judgment (or the detection judgment) at least on the condition that the comparison shows, or results in, a specified size relationship. This characteristic is for improving the reliability of the on-off judgment by focusing attention to the generally hill-shaped waveform which results only when pulsed detection light is received.

The other characteristic is related to both the light emitting means and the condition judging means. With a photoelectric switch with this characteristic, the light emitting means is adapted to emit pulsed light not only at a shorter period than that of the light from a fluorescent lamp in the presence of which the photoelectric switch is to function but also at least three times per pulse period of the fluorescent lamp. Moreover, the condition judging means is adapted not only to compare the level of the detection signal at a time at which a peak of the pulsed detection light is expected to arrive with a specified threshold value but also to carry out the on-off judgment according to the majority of the results of comparisons obtained during the period of light emission. In other words, this characteristic is for improving the reliability of the on-off judgment based on the fact that the noise waveform of the fluorescent lamp has only two sharply changing portions per period. The aforementioned first characteristic may be relied upon for obtaining the comparison result in the second characteristic.

These functions of the condition judgment means may be realized by hardware by using an analog comparator and a logic circuit or by software by using a microprocessor after the level-shifted detection signal is subjected to an A/D conversion process.

FIG. 1 shows the basic electric structure of a photoelectric switch 1 of the reflection type, according to a first embodiment of the invention, adapted to carry out the functions of the level-shifting means by hardware by using a dedicated analog circuit. It is characterized as having the first of the aforementioned two characteristics. In other words, its condition judging means is adapted to compare the levels of the light detection signal at a first timing at which a peak of the light detection signal waveform of the pulsed detection light is expected to arrive and a second timing at which the bottom due to an overshooting of the light detection signal waveform of the pulsed detection light is expected to arrive and to carry out the on-off judgment process at least on the condition that a specified size relationship is ascertained by the comparison.

As shown in FIG. 1, the photoelectric switch 1 comprises a light emitting means 2, a light receiving means 3, a filtering means 4, an A/D converter 5 and a CPU 6.

The light emitting means 2 comprises a driving means 7 and a light emitting element 8. The driving means 7 may be comprised of an LED driver circuit such as a constant current circuit and serves to supply a driving pulse (driving pulse signal) PD with pulse width TP and rest period TK (as shown in FIG. 5(A)) to the light emitting element 8 on the basis of a light emission control signal CD with a pulse waveform with period T (=TP+TK) outputted from a light emission control means 13 which may be realized as software by the CPU 6.

The light emitting element 8 comprises a light emitting diode (LED) according to this example and serves to emit light only during the periods corresponding to the pulse widths of the driving pulse PD supplied from the driving means 7 (as shown in FIG. 4(A)) to direct pulsed detection light LS to the area where a target object 20 may be expected to be present.

The light receiving means 3 comprises a light receiving element 9 and an amplifier 10. The light receiving element 9 may be comprised of a photodiode and serves to receive reflected light LR from the target object 20 and noise light LN from an inverter fluorescent lamp and to carry out photoelectric conversion. Electric signal VS1 obtained by photoelectric conversion of the reflected light LR from the target object 20 and electric signal VN1 obtained by photoelectric conversion of the noise light LN are superposed together to be supplied to the amplifier 10.

The amplifier 10 may comprise an operational amplifier with a variable gain and serves to amplify the electric signal (VS1+VN1) outputted from the light receiving element 9 at a specified gain and to generate and output a light detection signal (VS2+VN2). VS2 indicates the signal obtained by amplifying signal VS1, and VN2 indicates the signal obtained by amplifying signal VN1. The light detection signal (VS2+VN2) thus generated and outputted is then transmitted to the filtering means 4 placed on the downstream side.

The filtering means 4 functions as what is herein referred to as the level-shifting means which is one of the elements of the present invention, allowing to pass only signal component VS2 corresponding to the periodically pulsed reflected light LR but not allowing to pass signal component VN2 corresponding to the noise light LN from the fluorescent lamp. This is herein referred to as the filtering means because its function, as described above, is similar to that of the so-called comb filter which functions macroscopically.

Figure 5:
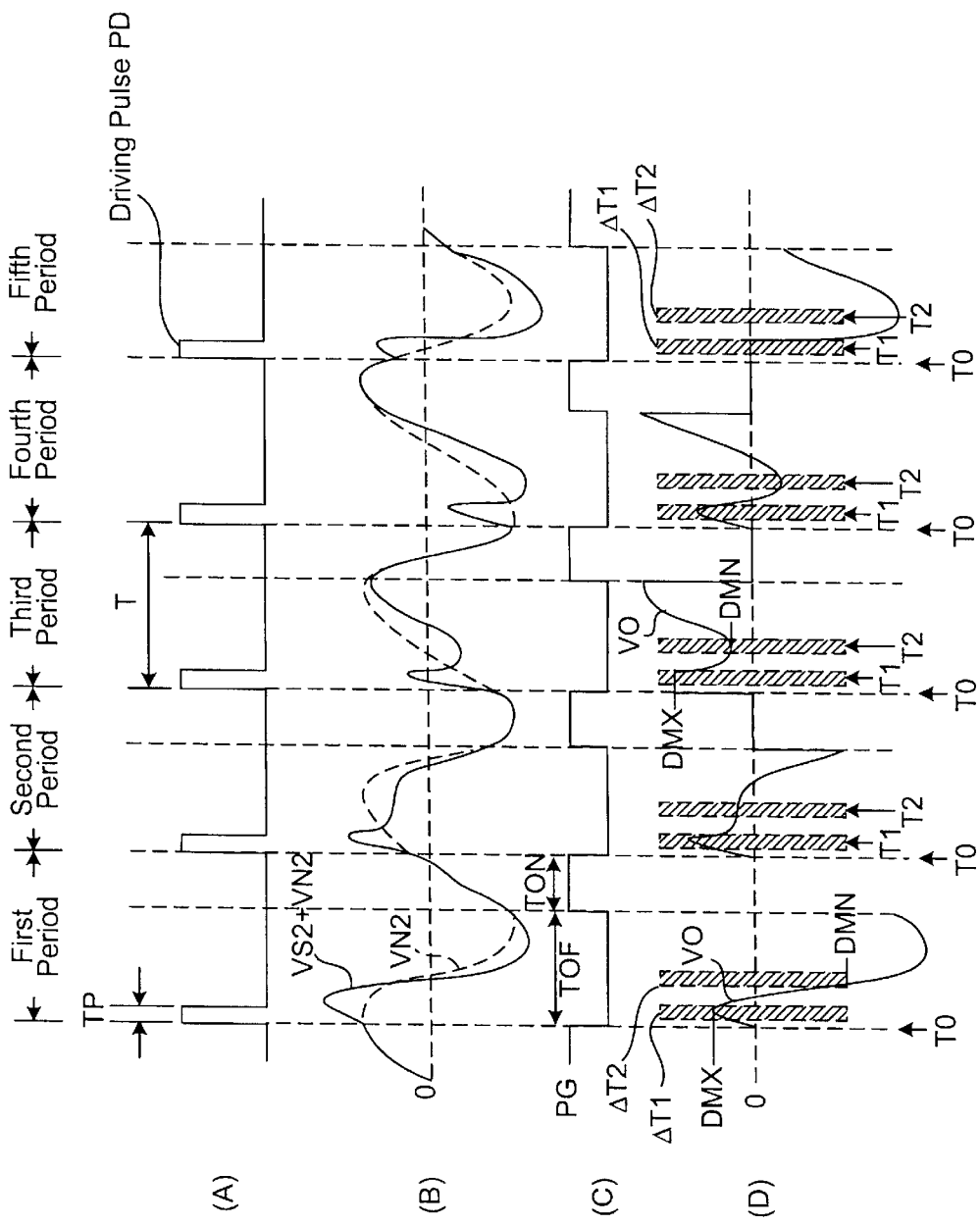
FIG. 5 is a waveform diagram of signals through various parts of FIG. 1.

The function of the filtering means 4 (or the level-shifting means) is to shift the level of the light detection signal (VS2+VN2) towards a specified potential level (the ground level GND, for example) by an amount corresponding to the difference between the level of the light detection signal (VS2+VN2) at the moment T0 when the reflect light LR of the pulsed detection signal is expected to arrive (as shown in FIG. 5) and the aforementioned specified level during a period in which the reflected light LR is expected to arrive. The data on moments T0 are generated by the CPU 6.

Figure 3:
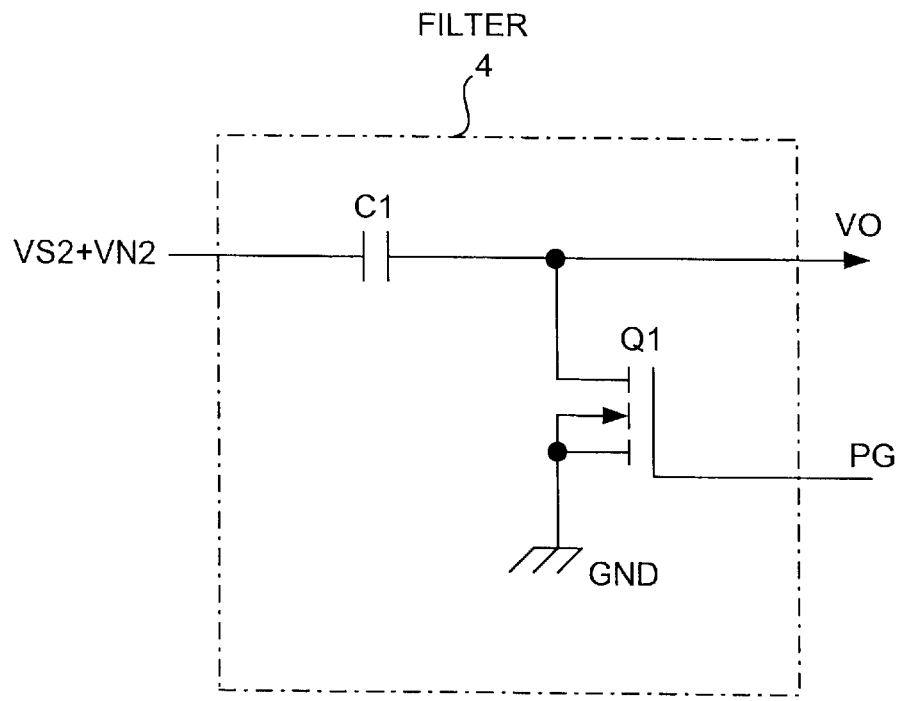
FIG. 3 is a circuit diagram of a dedicated analog circuit serving as the filtering means.

FIG. 3 shows the structure of an example of a circuit which may be used as an analog circuit dedicated to serve as the filtering means 4, including a connecting capacitor C1 inserted between an input terminal and an output terminal and an analog switch Q1 inserted between the output terminal and a point at the specified potential level (the ground GND in this example). When the analog switch Q1 is in the OFF condition, its output side is in a floating condition and the AC component of the signal on the input side is transmitted to the output side. When the analog switch Q1 is in the ON condition, its output side is kept at the specified potential level (GND). As the analog switch Q1 is switched from the ON condition to the OFF condition, its output side is released from the constraint and becomes floating. Since the AC component becomes transmissible between the input and output sides, the potential of the output signal VO becomes the superposition of the AC component on the input side and the specified level (GND). As explained above, any potential level other than the ground level may be selected as the "specified level".

In other words, this analog circuit may be referred to as an AC signal transmitting circuit for transmitting the AC component from the input side to the output side as the analog switch Q1 is switched off from the ON condition to the OFF condition and initializing the DC component to be superposed onto the AC component on the output side to the specified potential (GND) after the AC component begins to be transmitted.

The A/D converter 5 is for A/D converting the output signal VO from the filtering means 4 at timings T1 and T2 to be described below and shown in FIG. 5. The first timing T1 is when a peak in the light detection signal waveform of the pulsed detection light is expected to arrive and the second timing T2 is when the bottom in the light detection signal waveform of the pulsed detection light is expected to arrive after an overshoot period. These timings T1 and T2 are generated by the CPU 6, as will be described below. The A/D converter 5 outputs digital data DMX corresponding to peak values obtained by A/D conversion at the timing T1 and digital data DMN corresponding to bottom values obtained by A/D conversion at the timing T2.

The CPU 6 may comprise a microprocessor. Condition judging means 11, sampling pulse generating means 12 and light emission control means 13, shown inside the CPR 6 in FIG. 1, are functions to be carried out by the microprocessor by software.

The functions of the sampling pulse generating means 12 and the light emission control means 13 will be described next with reference to the waveform diagrams in FIG. 5.

The light emission control means 13 generates a standard timing signal (not shown) with period T on the basis of a standard clock contained in the CPU 6. The light emission control signal CD and sampling control signal CS are generated on the basis of this standard timing signal. The light emission control signal CD is a pulse signal with period T in synchronism with the standard timing signal, and its pulse width corresponds to the light emitting time of the light emitting element 8. FIG. 5(A) shows the waveform of the driving pulse PD generated by the operation of the driving means 7 corresponding to this light emission control signal CD. As can be seen from FIG. 5(A), the driving pulse PD is a pulse signal with period T and pulse width TP. The sampling control signal CS is also a pulse signal with period T in synchronism with the standard timing signal and is supplied to the sampling pulse generating means 12 for the generation of gate pulse PG and sampling pulse PS, to be described below.

The sampling pulse generating means 12 serves to generate gate pulse signal PG and sampling pulse signal PS on the basis of the sampling control signal CS supplied from the light emission control means 13. As shown in FIG. 5(C), the gate pulse signal PG is a pulse signal with period T(=TOF+TON) in synchronism with the standard timing signal. The gate pulse signal PG is at LOW ("L") level during period TOF (earlier referred to as the "specified light receiving period") from moment T0 immediately before the arrival of the reflected light LR at least until the signal portion VS2 corresponding to the reflected light LR is extinguished and at HIGH ("H") level during period TON thereafter until the moment T0 when the next reflected light LR arrives. This gate pulse signal PG is supplied to the analog switch Q1 of the AC signal transmission circuit serving as the filtering means 4. The analog switch Q1 is switched off when the gate pulse signal PG is "L" and is switched on when the gate pulse signal PG is "H". The output from the AC signal transmission circuit serving as the filtering means 4 varies according to the AC portion on its input side when the analog switch Q1 is switched off and remains at the GND level independently of the AC portion on the input side when the analog switch Q1 is switched on.

The sampling pulse signal PS (not shown in FIG. 5) includes first and second timing signals respectively indicating the aforementioned first and second timings T1 and T2. These timing signals are set at specified time intervals after the timing T0 immediately before the arrival of the reflected light. The timing signals are supplied to the A/D converter 5, which serves to generate digital data DMX and DMN respectively by A/D-converting the first and second timing signals T1 and T2. The digital data DMX and DMN are used for the on-off judgment process by the condition judging means 11.

Figure 4:
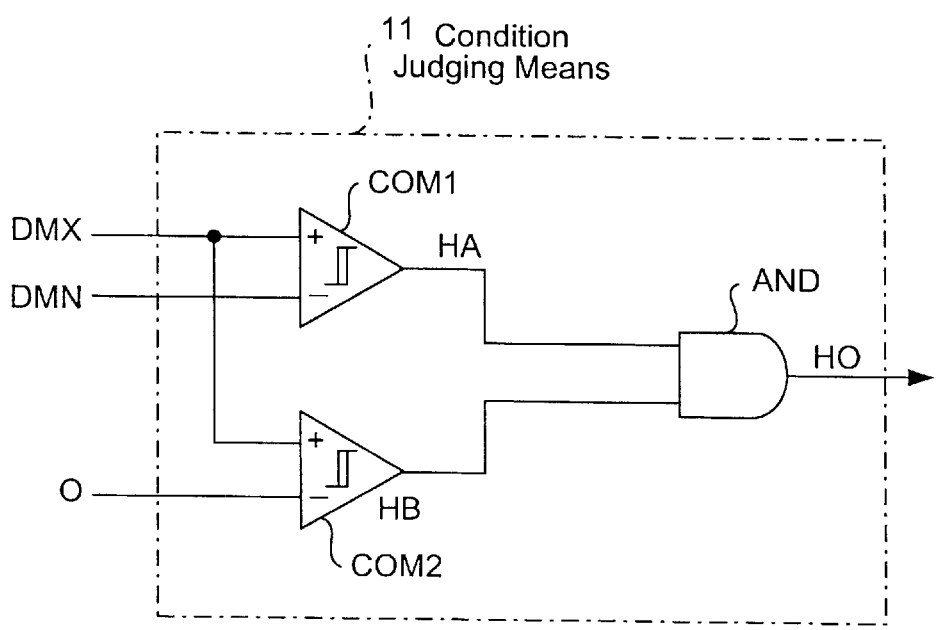
FIG. 4 is a conceptual diagram showing the functions of the condition judging means by using logic symbols.

FIG. 4 uses logical symbols to explain the functions of the condition judging means 11 as they may be carried out by software by the microprocessor of the CPU 6. As shown therein, the functions of the condition judging means 11 may be described as being performable by means of two comparators COM1 and COM2 and one AND gate, the first comparator COM1 serving to compare and obtain the size relationship between the digital data DMX and DMN, the second comparator COM2 serving to compare and obtain the size relationship between the digital data item DMX and the specified (zero) level, and the AND gate serving to output the logical product of outputs HA and HB respectively from the first and second comparators COM1 and COM2. The output HO from the AND gate becomes "H" only when the DMX is greater than DMN and also DMX is greater than the specified (zero) level, indicating that the reflected light LR has been received.

FIGS. 5(B) and 5(D) respectively show the waveform of the input signal to and output signal from the AC signal transmission circuit serving as the filtering means 4. As can be understood by comparing FIGS. 5(B) and 5(D), the input signal waveform (as shown in FIG. 5(B)) is level-shifted as a whole upward or downward during time interval TOF such that the level of the output signal at the beginning T0 of this period (immediately before the arrival of the reflected light LR) is shifted down to the zero level as shown in FIG. 5(D). In the example of FIG. 5, the input signal waveform (of FIG. 5(B)) is shifted as a whole downward in the first, second and fifth periods and upward in the third and fourth periods to obtain the output signal waveform (of FIG. 5(D)). Thus, the level-shifted waveform of FIG. 5(D) always starts from the same specified (zero) level in each period to described a hill-shaped waveform characteristic of the reflected light LR within a specified time interval TOF.

Explained more in detail, the signal level DMX at the first timing T1 is always higher than the signal level DMN at the second timing T2 as long as reflected light LR with a specified quantity of light is being received. This relationship becomes satisfied also while there is no reflected light LR being received if the timing T0 immediately before the arrival of the reflected light happens to coincide with a point in time at which the noise waveform from the fluorescent lamp drops suddenly. In such a case, however, the polarity of the signal level DMX at the first timing T1 does not fail to become smaller than the specified (zero) level. In other words, an erroneous judgment can be avoided if it is concluded that there is no reflected light LR present, although the signal level at the first timing T1 is found to be higher than that at the second timing T2, if the signal level at the first timing T1 is smaller than the specified (zero) level.

Thus, the presence or absence of reflected light LR can be correctly determined if the digital data DMX and DMN outputted from the A/D converter 5 are supplied to the condition judging means 11 explained above with reference to FIG. 4. Even if there are variations in the timings T1 and T2 to the extents of ΔT1 and ΔT2, as shown in FIG. 5, the size relationship between the digital data DMX and DMN is almost unaffected and since DMX is larger than the specified (zero) level, presence or absence of reflected light can be reliably determined in spite of variations in the gate pulse signal PG and the sampling pulse signal PS.

According to the embodiment of the invention described above, a comparison is made between the level (DMX) of the light detection signal at the first timing T1 when a peak of the detection signal of a pulsed detection light is expected to arrive and the level (DMN) of the light detection signal at the second timing T2 when a bottom of the light detection signal after overshooting is expected to arrive. If this comparison shows a specified size relationship, it is concluded that one of the conditions to be relied upon for the on-off judgment is satisfied. Thus, even if the sampling timings T1 and T2 are somewhat displaced from those of the peak or bottom of the waveform of the detection signal, the size relationship between DMX and DMN is nearly unaffected thereby and a reliable on-off judgment is possible as long as a detection signal waveform characteristically of the pulsed detection light is present within the sampling region.

Moreover, the condition judging means is designed to carry out the on-off judgment process not only according to the result of the comparison, or the size relationship between the signal levels DMX and DMN at the first and second timing T1 and T2, but also on the condition that the level of the detection signal at the first timing T1 is higher than the zero level serving as a specified level. Thus, even if the timing T0 immediately before the expected arrival time of the pulsed detection light happens to coincide with sharply dropping moment of the detection signal waveform (180° in FIG. 9) such that an accurate on-off judgment cannot be made from the size relationship between DMX and DMN alone because of the possibility that the reflected light from the pulsed detection light is absent or hardly present, a reliable on-off judgment becomes possible by considering the size relationship between the level DMX at the first timing T1 and the zero level because this difference is significant between when there is normal reflected light and when there is none.

The invention has thus far been explained with reference to a photoelectric switch of the reflection type but it goes without saying that the present invention is applicable also to photoelectric switches of the transmission type. An example of such a photoelectric switch of the transmission type is shown in FIG. 2, for the purpose of completeness of disclosure, with like components indicated by the same numerals and repetitious descriptions being omitted.

Figure 2:
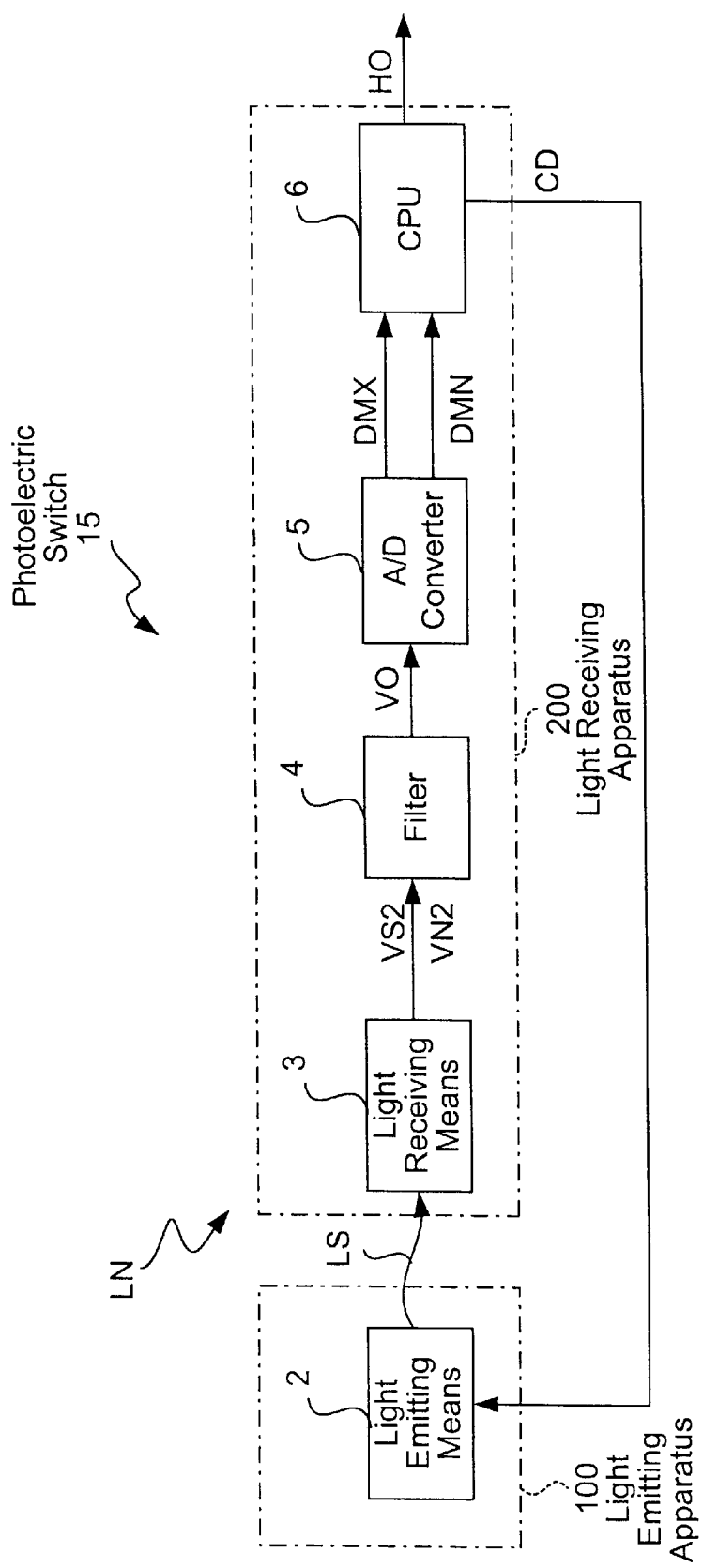
FIG. 2 is a basic structural diagram of a photoelectric switch of the transmission type according to a first embodiment of the invention.

As shown in FIG. 2, a photoelectric switch 15 of the transmission type has a light emitting apparatus 100 and a light receiving apparatus 200. The light emitting apparatus 100 includes a light emitting means 2, and the light receiving apparatus 200 includes a light receiving means 3, a filtering means 4, an A/D converter 5 and a CPU 6. A light emission control signal CD is transmitted from the CPU6 inside the light receiving apparatus 200 to the light emitting means 2 inside the light transmitting apparatus 100 through a communication line. Since the light emission control signal CD is transmitted through a communication line from the light receiving apparatus 200 to the light emitting apparatus 100 in the case of such a photoelectric switch of the transmission type, it is very difficult to precisely synchronize the timing of light emission with the sampling timing. The on-off judgment process according to this invention is therefore particularly effective for such a photoelectric switch because the effects of the variations in the sampling timing are small.

Figure 6:
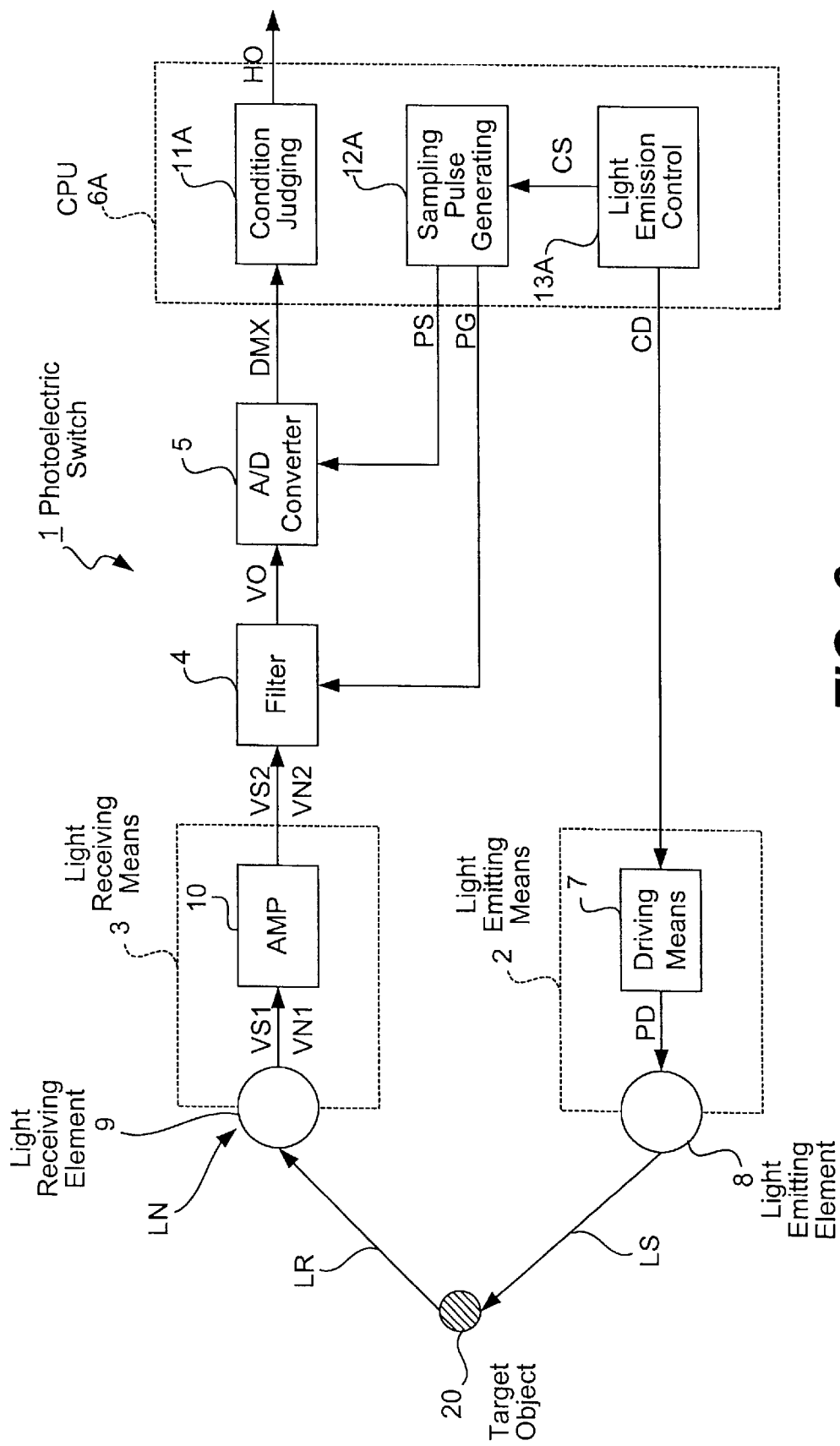
FIG. 6 is a basic structural diagram of another photoelectric switch of the reflection type according to a second embodiment of the invention.

FIG. 6 shows the basic structure of a photoelectric switch 1A of the reflection type according to a second embodiment of the invention, adapted to carry out the functions of the level-shifting means by hardware by using a dedicated analog circuit. It is characterized as having the second of the aforementioned two characteristics. Thus, it is adapted to emit light at least three times within the period TN of the inverter fluorescent lamp in the environment (or the period of the noise of the fluorescent lamp). The condition judging means compares the level VMX of the detection signal at the timing T1 when a peak of the pulse detection light LS is expected to arrive with a specified threshold value Vth and carried out the on-off judgment process according to the majority of the comparison results obtained within the period TN.

In FIG. 6, components which are similar or alike with those shown in FIG. 1 are indicated by the same numerals and will not be repetitiously described. Thus, the photoelectric switch 1A is shown as comprising a light emitting means 2, a light receiving means 3, a filtering means 4, an A/D converter 5A and a CPU 6A. The CPU 6A includes a condition judging means 11A, a sampling pulse generating means 12A and a light emission control means 13A.

Figure 7:
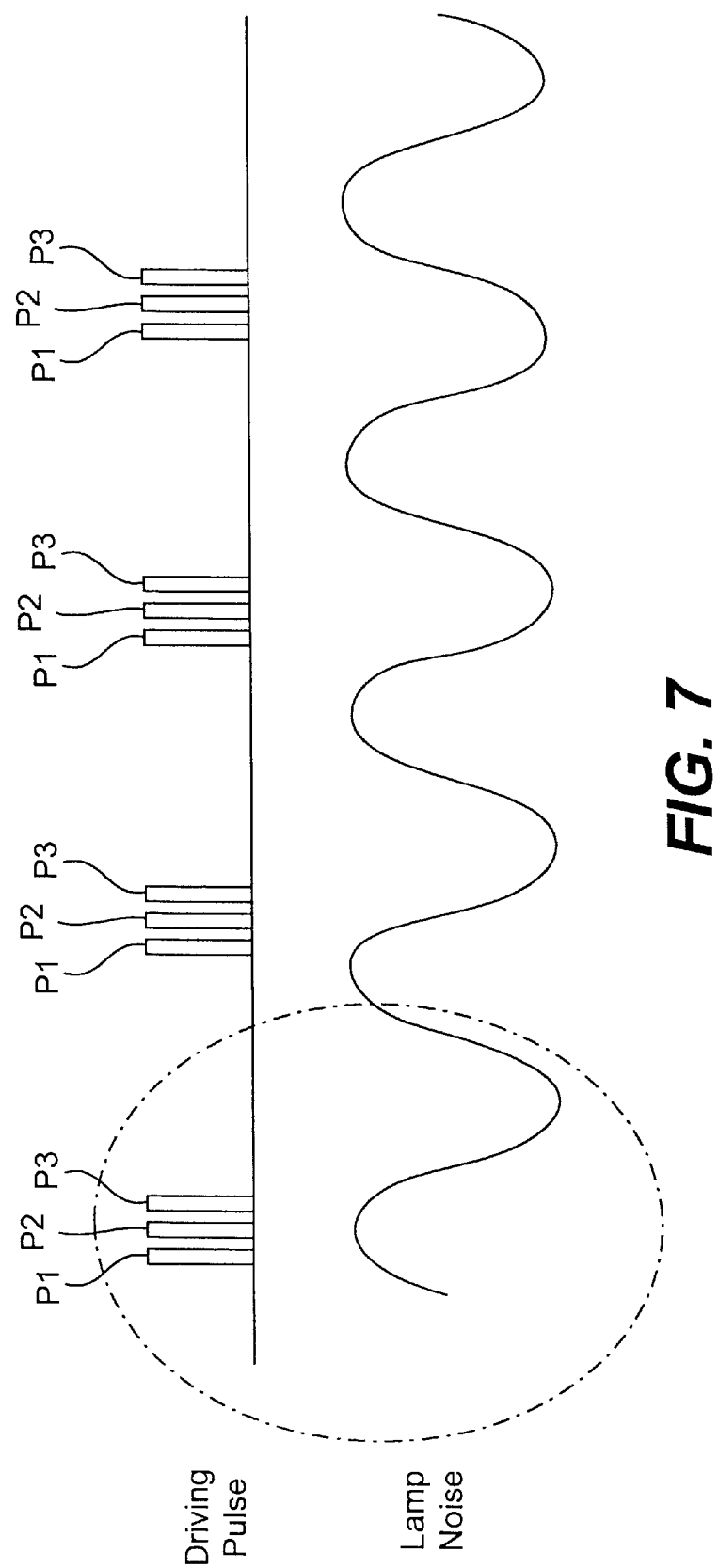
FIG. 7 is a waveform diagram for showing the relationship between the waveform of noise from a fluorescent lamp and driving pulse.
Figure 8:
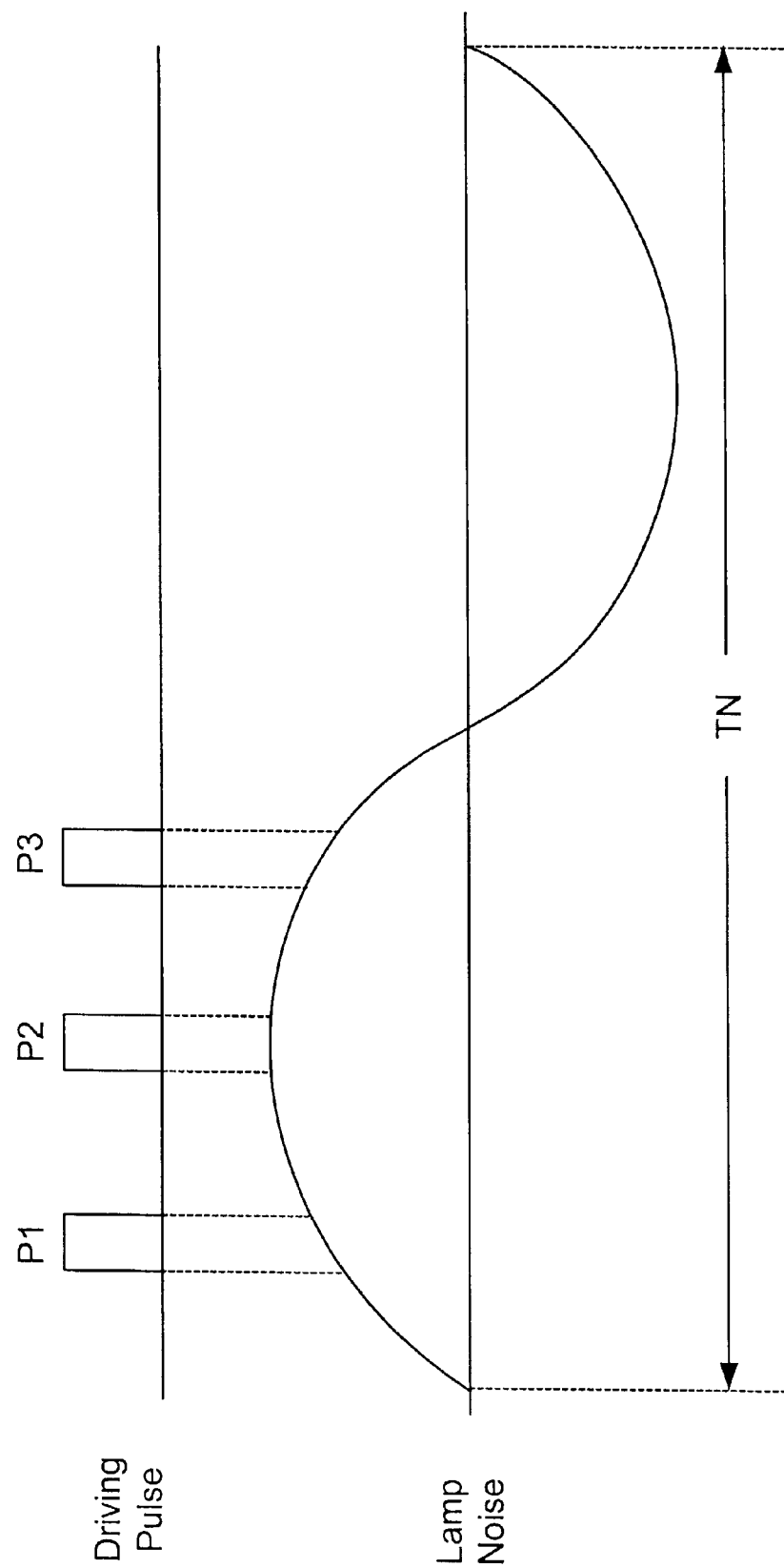
FIG. 8 is a waveform diagram for showing the synchronism relationship between the timing for the generation and frequency of pulse for the fluorescent lamp.

The light emission control means 13A generates a standard timing signal (not shown) for specifying a light emission period on the basis of a standard clock contained in the CPU 6A. The period of this standard timing signal is set to be about equal to the shortest of the noise periods of the fluorescent lamps anticipated to be present (such as 60–70 μsec). The light emission control means 13A also generates a light emission control signal CD for controlling the light emitting means 2 on the basis of this standard timing signal. This light emission control signal CD has at least three timing components. As shown in FIGS. 7 and 8, for example, three driving pulses P1, P2 and P3 are outputted from the driving means 7 sequentially at specified intervals within a noise period TN as the driving signal CD is supplied to the driving means 7. The light emitting element 8 is driven by these driving pulses P1, P2 and P3 and the pulsed detection light LS is emitted at the specified intervals to an area 20 where a target objected may be expected to be present. After the reflected light LR from the target object 20 is received by the light receiving element 9, the reflected light LR and the noise light LN are photoelectrically converted through the light receiving element 9, as explained above with reference to the embodiment with the first characteristic. The electric signals VS1 and VN1 thus obtained are amplified by the amplifier 10 and the light detection signal VS2+VN2 is generated and outputted.

Figure 9:
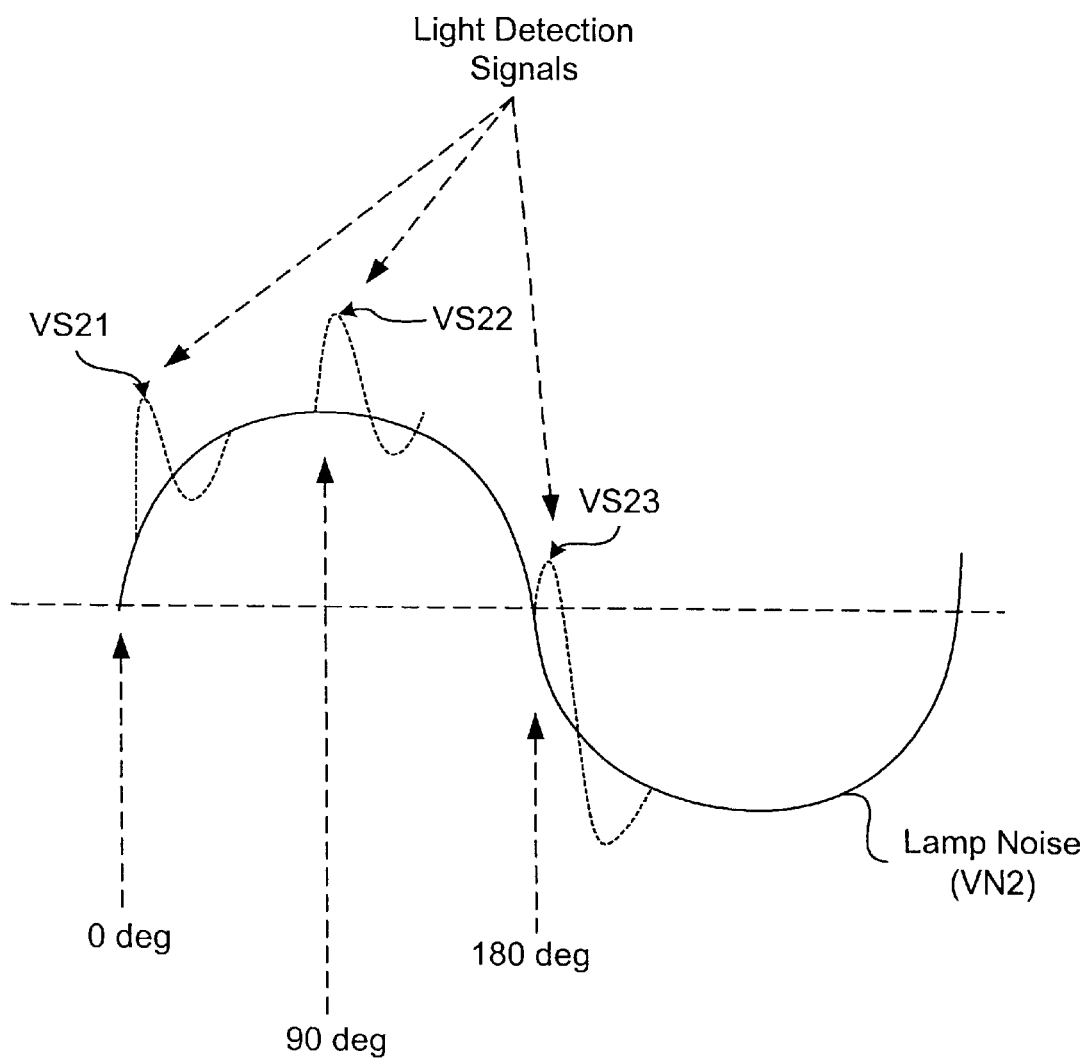
FIG. 9 is a waveform diagram for showing the relationship between the noise of fluorescent lamp and the driving pulse signal.

FIG. 9 shows the relationship between the light detection signal VS2 and the noise signal VN2 from the fluorescent lamp thus generated. As shown, the intervals between the three signals VS21, VS22 and VS23 are set such that even in the worst situation where the first and the last of the signals (such as VS21 and VS23) happen to coincide with the phases 0° and 180° of the noise of the fluorescent lamp, the middle signal VS22 will fall upon the phase angle of 90° where the rate of change is the gentlest.

Figure 10:
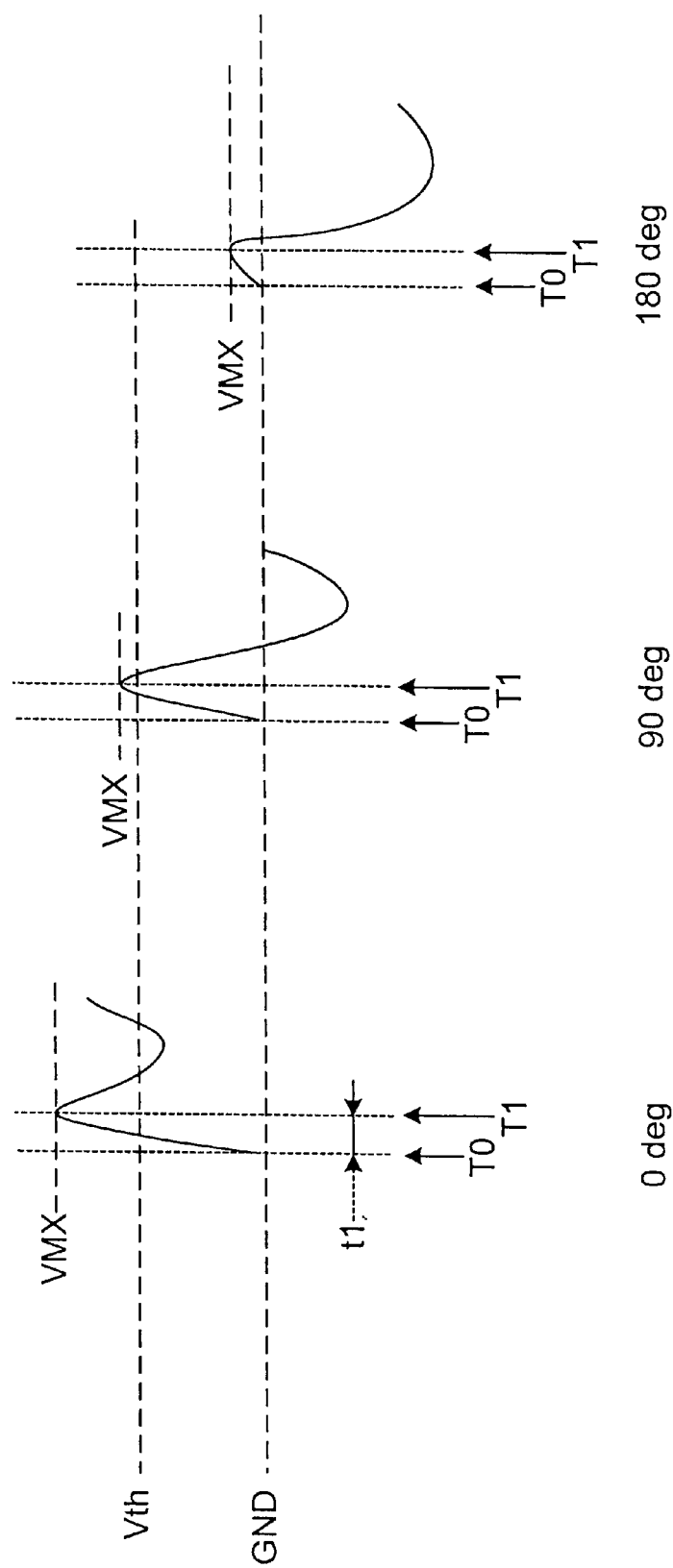
FIG. 10 is a waveform diagram for showing the relationship between portions of the level-shifted detection signals and the threshold value.

The filtering means 4 serves to level-shift the detection signal VS2+VN2 received from the light receiving means 3 in the same way as explained above with reference to the first embodiment of this invention. FIG. 10 shows the light detection signals thus level-shifted. When there is no reflected light LR being received, each of the three signals VS21, VS22 and VS23 must exceed the threshold value Vth at the first timing T1. In the aforementioned worse situation, signals VS21 and VS22 with timings corresponding to phases 0° and 90° of the noise waveform exceed the threshold value Vth but signal VS23 corresponding to phase 180° cannot exceed the threshold value. On the other hand, if only the noise light LN is present such that none of the three signals VS21, VS22 and VS23 should exceed the threshold value Vth, the values of the signals VS22 and VS23 corresponding to phases 90° and 180° will each exceed the threshold value Vth but the signal VS21 with timing corresponding to phase 0° will exceed the threshold value Vth, although not shown. Thus, of the three judging operations which takes place within one period TN of noise, if the signal value exceeds the threshold value twice or more, it is concluded as ON and if the signal value does not exceed the threshold value twice or more, it is concluded as OFF. If this principle of decision by the majority is followed, therefore, a more reliable on-off judgment process can be carried out.

The condition judging means 11A carries out an on-off judgment process on the basis of the data DMX obtained from the A/D converter 5A by the algorithm described above. If this function of the condition judging means 11A is to be carried out by software by using a microprocessor, its flow chart may look as shown in FIG. 11.

Figure 11:
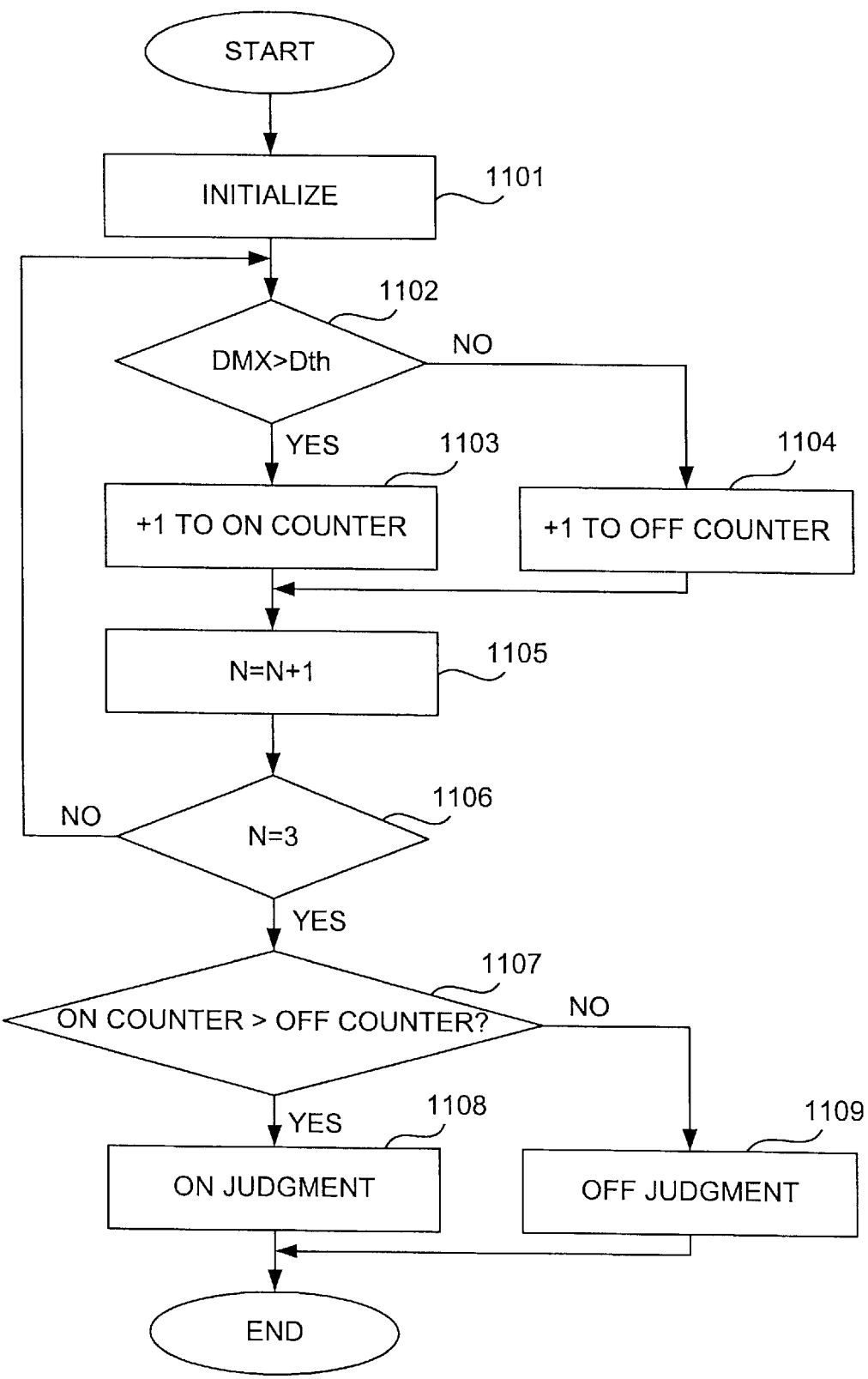
FIG. 11 is a flowchart of the operations of the condition judging means.
Figure 12:
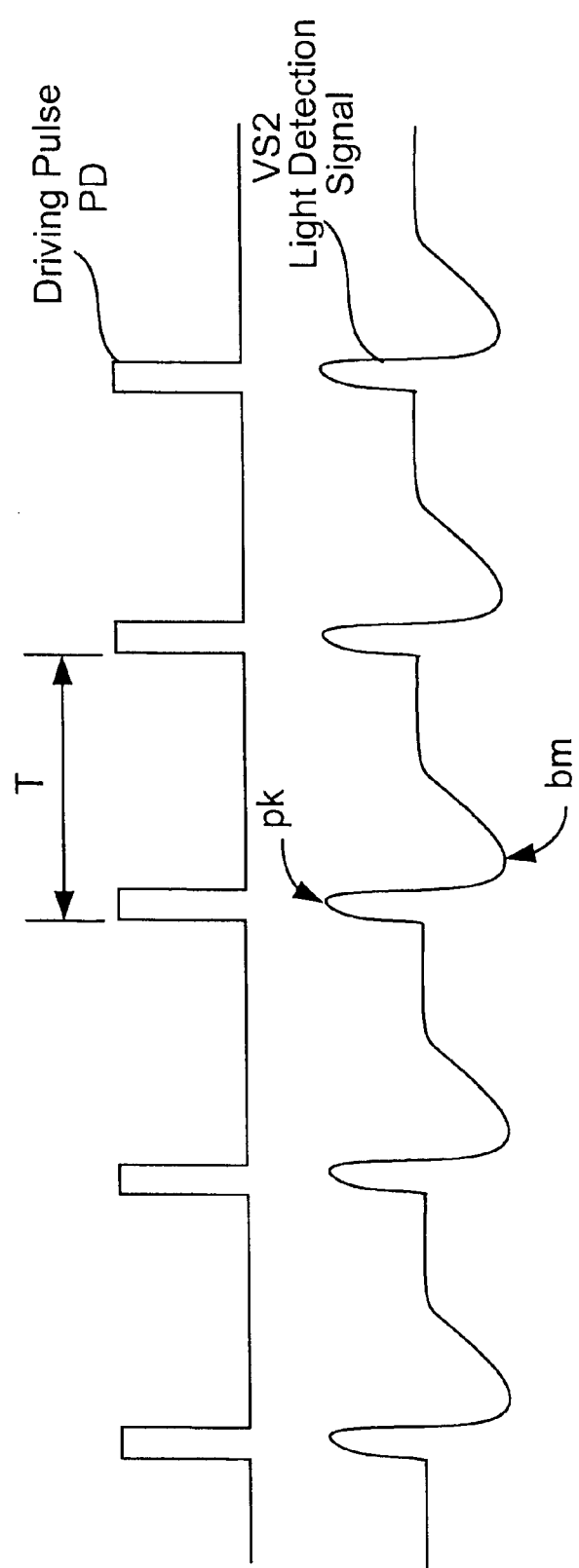
FIG. 12 is a waveform diagram for showing the relationship between the drive pulse and detection signal when there is no noise due to a fluorescent lamp.
Figure 13:
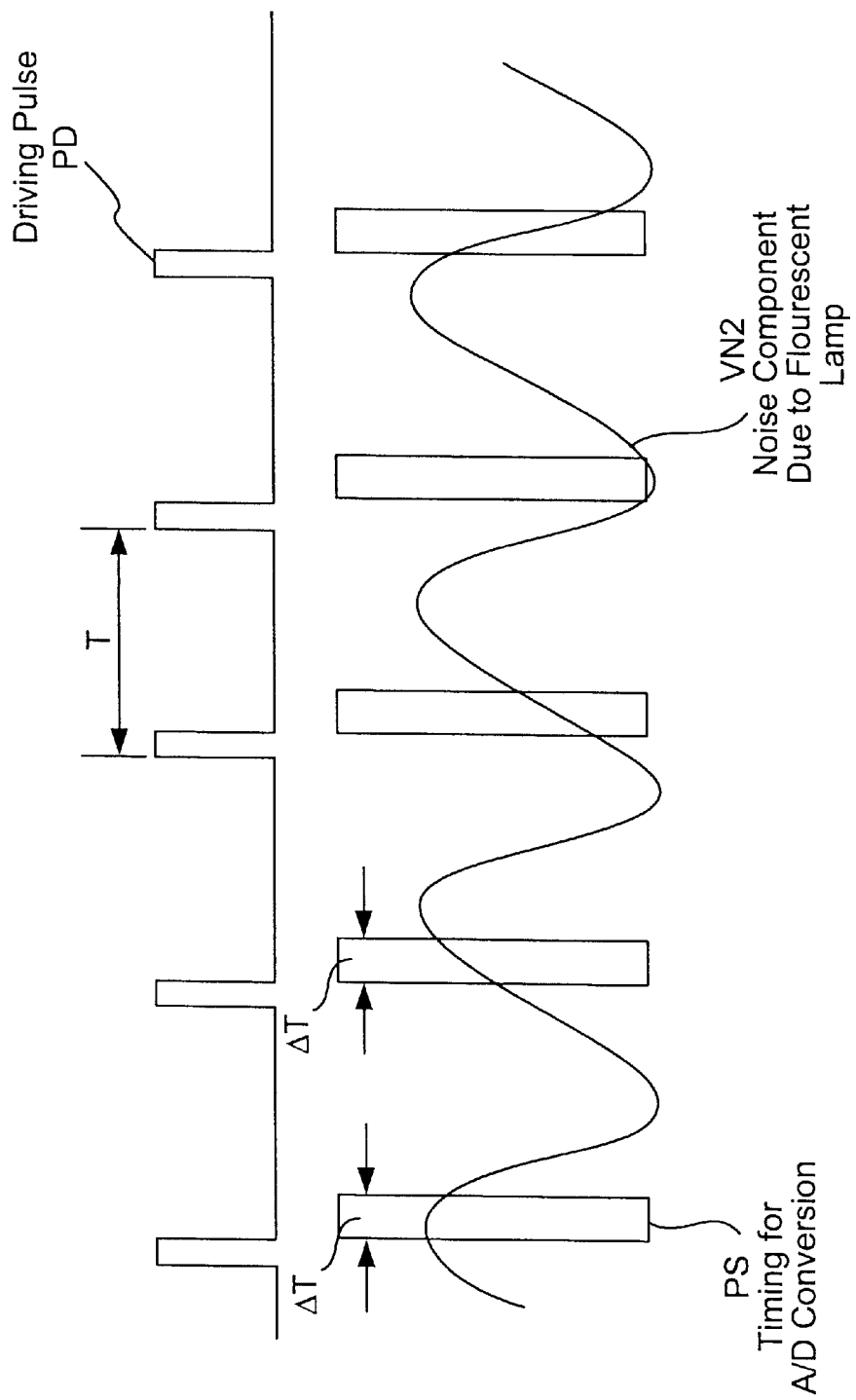
FIG. 13 is a waveform diagram for showing the relationship between the drive pulse and the timing for A/D conversion in the presence of noise due to a fluorescent lamp.

With reference to FIG. 11, as the on-off judgment process is started, an initialization process is carried out first (Step 1101) to initialize counters and registers to be used for the calculation. Next, the first digital data item DMX read from the A/D converter 5A is compared with a threshold value Dth (Step 1102). If it is adjudged that DMX>Dth (YES in Step 1102), a specified ON counter is incremented by +1 (Step 1103). If it is adjudged that DMX<Dth (NO in Step 1102), a specified OFF counter is incremented by +1 (Step 1104). The counter for data number N is thereafter incremented by +1 (Step 1105). Steps 1102–1105 are repeated until the data number N reaches 3. When the data number N reaches 3 (YES in Step 1106), the numbers in the ON counter and the OFF counter are compared (Step 1107). If the number in the ON counter is greater than that in the OFF counter (Yes in Step 1107), an ON signal is outputted as the result of the on-off judgment process (Step 1108). If the number in the ON counter is less than that in the OFF counter (NO in Step 1107), an OFF signal is outputted as the result of the on-off judgment process (Step 1109). This result of on-off judgment according to the principle of majority decision is one of the judgment elements for rendering the final on-off determination, or the detection or non-detection of a target object.

The waveform for the noise for an inverter type fluorescent lamp is nearly sinusoidal. Thus, the waveform has only two sharp (or quickly changing) position within each cycle (or period of TN). According to the second embodiment of the invention described above, detection light is emitted at least three times per cycle of light emission from the lamp. Thus, even in the worst situation where one of the timings for light emission coincided with a sharply rising timing of the waveform of the noise and another coincided with its sharply falling timing such that an erroneous judgment may be rendered at either of these timings, the rest should coincide with a gently varying portion of the waveform. Thus, in addition to obtaining the result of comparison between the level VMX of light detection signal at the timing T1 when a peak of the pulsed detection light is expected to arrive and a specified threshold value Vth, it is concluded that one of the conditions to be used for the on-off judgment is satisfied according to the majority of the judgment results obtained during the period of light emission.

As explained above, the present invention provides a photoelectric switch with a level-shifting function with which an on-off judgment (or the judgment of presence or absence of a target object) can be reliably outputted. With a photoelectric switch of this invention, a reliable on-off judgment can be outputted even if there are some variations in the sampling timing for the light detection signals to be used for the on-off judgment or if the sampling timing happened to coincide with a sharply varying portion of the waveform of the detection signal due to a noise component.

What is claimed is:

1. A photoelectric switch comprising:

a light emitting means for periodically emitting pulsed detection light;

a light receiving means for photoelectrically converting said pulsed detection light and thereby outputting corresponding light detection signals; and a signal processing means for generating an on-off judgment output for switching on or off said photoelectric switch;

said signal processing means including:

a level shifting means for shifting the level of the light detection signals towards a specified level during a specified light receiving period by an amount corresponding to the difference between said specified level and the level of the light detection signal at a time immediately before said pulsed detection light is expected to arrive; and a condition judging means for judging, on the basis of the light detection signal with the level shifted by said level shifting means, whether or not at least one of conditions to be used for generating said on-off judgment output is satisfied;

wherein said condition judging means serves to generate said on-off judgment output at least on the condition that the levels of the light detection signal at a first timing when a peak of the light detection signal is expected to arrive and at a second timing when a bottom of the light detection signal after an overshoot period is expected to arrive are in a specified size relationship.

2. The photoelectric switch of claim 1 wherein said condition judging means serves to generate said on-off judgment output on an additional condition that the level of the light detection signal at said first timing and said specified level are in a specified size relationship.

3. A photoelectric switch comprising:
a light emitting means for periodically emitting pulsed detection light;
a light receiving means for photoelectrically converting said pulsed detection light and thereby outputting corresponding light detection signals; and
a signal processing means for generating an on-off judgment output for switching on or off said photoelectric switch;
said signal processing means including:
   a level shifting means for shifting the level of the light detection signals towards a specified level during a specified light receiving period by an amount corresponding to the difference between said specified level and the level of the light detection signal at a time immediately before said pulsed detection light is expected to arrive; and
   a condition judging means for judging, on the basis of the light detection signal with the level shifted by said level shifting means, whether or not at least one of conditions to be used for generating said on-off judgment output is satisfied;
   wherein said light emitting means is controlled to emit light at least three times per period of light emission from a fluorescent lamp in an environment of said photoelectric switch; and
   wherein said condition judging means obtains a plurality of comparison results by comparing a specified level and the level of the light detection signal at times when a peak of said pulsed detection light is expected to arrive and generates said on-off judgment output according to the majority of the comparison results obtained within a period of light emission.

4. The photoelectric switch of claim 1 wherein said light emitting means includes a driving means for outputting a driving pulse signal at a timing specified by a light emission control signal and a light emitting element for emitting pulsed detection light to a specified target region in response to said driving pulse signal outputted from said light emitting means;
   wherein said light receiving means includes a light receiving element for receiving reflection of said pulsed detection light arriving from said target region and carrying out photoelectric conversion on the received reflected light and an amplifier for generating a light detection signal by amplifying the output from said light receiving element.

5. The photoelectric switch of claim 4 wherein said condition judging means serves to generate said on-off judgment output on an additional condition that the level of the light detection signal at said first timing and said specified level are in a specified size relationship.

6. The photoelectric switch of claim 3 wherein said light emitting means includes a driving means for outputting a driving pulse signal at a timing specified by a light emission control signal and a light emitting element for emitting pulsed detection light to a specified target region in response to said driving pulse signal outputted from said light emitting means;
   wherein said light receiving means includes a light receiving element for receiving reflection of said pulsed detection light arriving from said target region and carrying out photoelectric conversion on the received reflected light and an amplifier for generating a light detection signal by amplifying the output from said light receiving element.

7. The photoelectric switch of claim 4 wherein said level shifting means comprises an AC signal transmitting circuit having an input side and an output side, said AC signal transmitting circuit functioning to transmit AC components of signals on said input side to said output side, to initialize DC potential to be superposed to the AC component on said output side to a specified potential level, and to repeatedly initialize the DC potential to be superposed to the AC component on said output side to said specified potential immediately before the timing at which said pulsed detection light is expected to arrive.

8. The photoelectric switch of claim 5 wherein said level shifting means comprises an AC signal transmitting circuit having an input side and an output side, said AC signal transmitting circuit functioning to transmit AC components of signals on said input side to said output side, to initialize DC potential to be superposed to the AC component on said output side to a specified potential level, and to repeatedly initialize the DC potential to be superposed to the AC component on said output side to said specified potential immediately before the timing at which said pulsed detection light is expected to arrive.

9. The photoelectric switch of claim 6 wherein said level shifting means comprises an AC signal transmitting circuit having an input side and an output side, said AC signal transmitting circuit functioning to transmit AC components of signals on said input side to said output side, to initialize DC potential to be superposed to the AC component on said output side to a specified potential level, and to repeatedly initialize the DC potential to be superposed to the AC component on said output side to said specified potential immediately before the timing at which said pulsed detection light is expected to arrive.

10. The photoelectric switch of claim 7 wherein said AC signal transmitting circuit comprises a capacitor inserted between an input terminal and an output terminal and a switch inserted between said output terminal and a position at a specified potential, said switch being controlled to be switched on and off by a gate control signal in synchronism with said light emission control signal.

11. The photoelectric switch of claim 8 wherein said AC signal transmitting circuit comprises a capacitor inserted between an input terminal and an output terminal and a switch inserted between said output terminal and a position at a specified potential, said switch being controlled to be switched on and off by a gate control signal in synchronism with said light emission control signal.

12. The photoelectric switch of claim 9 wherein said AC signal transmitting circuit comprises a capacitor inserted between an input terminal and an output terminal and a switch inserted between said output terminal and a position at a specified potential, said switch being controlled to be switched on and off by a gate control signal in synchronism with said light emission control signal.

13. The photoelectric switch of claim 7 further comprising a microprocessor wherein calculations for ascertaining said size relationship is carried out by software by means of said microprocessor by using digital data obtained by A/D conversion of signals outputted from said AC signal transmitting circuit.

14. The photoelectric switch of claim 8 further comprising a microprocessor wherein calculations for ascertaining said size relationship is carried out by software by means of said microprocessor by using digital data obtained by A/D conversion of signals outputted from said AC signal transmitting circuit.

15. The photoelectric switch of claim 9 further comprising a microprocessor wherein calculations for ascertaining said size relationship is carried out by software by means of said microprocessor by using digital data obtained by A/D conversion of signals outputted from said AC signal transmitting circuit.

16. The photoelectric switch of claim 4 comprising a light emitting apparatus and a light receiving apparatus which are separated from each other, said light emitting means being contained in said light emitting apparatus, said light receiving means and said signal processing means being contained in said light receiving apparatus, said light emission control signals being transmitted from said light emitting apparatus to said light receiving apparatus through a communication line.

17. The photoelectric switch of claim 5 comprising a light emitting apparatus and a light receiving apparatus which are separated from each other, said light emitting means being contained in said light emitting apparatus, said light receiving means and said signal processing means being contained in said light receiving apparatus, said light emission control signals being transmitted from said light emitting apparatus to said light receiving apparatus through a communication line.

18. The photoelectric switch of claim 6 comprising a light emitting apparatus and a light receiving apparatus which are separated from each other, said light emitting means being contained in said light emitting apparatus, said light receiving means and said signal processing means being contained in said light receiving apparatus, said light emission control signals being transmitted from said light emitting apparatus to said light receiving apparatus through a communication line.

* * * * *